United States Patent
Rudmann et al.

(10) Patent No.: US 9,786,820 B2
(45) Date of Patent: Oct. 10, 2017

(54) OPTO-ELECTRONIC MODULE AND METHOD FOR MANUFACTURING THE SAME

(71) Applicant: Heptagon Micro Optics Pte. Ltd., Singapore (SG)

(72) Inventors: Hartmut Rudmann, Jona (CH); Michel Barge, Aeugst am Albis (CH)

(73) Assignee: Heptagon Micro Optics Pte. Ltd., Singapore (SG)

( * ) Notice: Subject to any disclaimer, the term of this patent is extended or adjusted under 35 U.S.C. 154(b) by 0 days.

(21) Appl. No.: 14/945,505

(22) Filed: Nov. 19, 2015

(65) Prior Publication Data
US 2016/0072023 A1 Mar. 10, 2016

Related U.S. Application Data

(62) Division of application No. 13/569,707, filed on Aug. 8, 2012, now Pat. No. 9,224,772.
(Continued)

(51) Int. Cl.
*H01L 29/18* (2006.01)
*H01L 33/48* (2010.01)
(Continued)

(52) U.S. Cl.
CPC .......... *H01L 33/486* (2013.01); *H01L 25/167* (2013.01); *H01L 27/14618* (2013.01);
(Continued)

(58) Field of Classification Search
CPC ................. H01L 33/486; H01L 25/167; H01L 27/14618; H01L 27/14625
See application file for complete search history.

(56) References Cited

U.S. PATENT DOCUMENTS 5,912,872 A 6/1999 Feldman et al.
6,610,166 B1 8/2003 Harden et al.
(Continued)

FOREIGN PATENT DOCUMENTS

CN 101459165 6/2009
JP H03-16168 1/1991
(Continued)

OTHER PUBLICATIONS

State Intellectual Property Office of China, Office Action issued in Chinese Application No. 201280049588.9, dated Jan. 22, 2017, 25 pages, (with English Translation).

*Primary Examiner* — Bradley K Smith
(74) *Attorney, Agent, or Firm* — Fish & Richardson P.C.

(57) ABSTRACT

A method for manufacturing a device (1) is suggested. The device comprises at least one opto-electronic module (1), and the method comprises creating a wafer stack (2) comprising a substrate wafer (PW), and an optics wafer (OW); wherein a multitude of active optical components (E) is mounted on the substrate wafer (PW), and the optics wafer (OW) comprises a multitude of passive optical components (L). Each of the opto-electronic modules (1) comprises at least one of the active optical components (E) and at least one of the passive optical components (L). The optics wafer (OW) can comprise at least one portion, referred to as blocking portion, which is at least substantially non-transparent for at least a specific wavelength range, and at least one other portion, referred to as transparent portion, which is at least substantially non-transparent for at least said specific wavelength range. 11. The opto-electronic module comprises a substrate member; an optics member; at least one active optical component mounted on said substrate member; and at least one passive optical component comprised in said optics member. The optics member (OW) is directly or indirectly fixed to said substrate member (PW).

(Continued)

The opto-electronic modules (1) can have an excellent manufacturability while being small in dimension and having a high alignment accuracy.

22 Claims, 5 Drawing Sheets

Related U.S. Application Data (60) Provisional application No. 61/521,818, filed on Aug. 10, 2011.

(51) Int. Cl.

| | | |
|---|---|---|
| H01L 25/16 | (2006.01) | |
| H01L 27/146 | (2006.01) | |
| H01L 31/0232 | (2014.01) | |
| H01L 33/58 | (2010.01) | |
| H01L 33/62 | (2010.01) | |

(52) U.S. Cl.
CPC .. *H01L 27/14625* (2013.01); *H01L 27/14683* (2013.01); *H01L 27/14685* (2013.01); *H01L 31/02327* (2013.01); *H01L 33/58* (2013.01); *H01L 33/62* (2013.01); *H01L 2224/16* (2013.01); *H01L 2224/48091* (2013.01); *H01L 2224/73265* (2013.01); *H01L 2924/12044* (2013.01); *H01L 2933/0033* (2013.01); *H01L 2933/0058* (2013.01); *H01L 2933/0066* (2013.01)

(56) References Cited

U.S. PATENT DOCUMENTS

| | | |
|---|---|---|
| 7,148,502 B2 | 12/2006 | Yamazaki et al. |
| 7,245,065 B2 | 7/2007 | Ghosh et al. |
| 7,750,358 B2 | 7/2010 | Shiraishi et al. |
| 7,915,627 B2 | 3/2011 | Li |
| 7,960,196 B2 | 6/2011 | Kim |
| 8,013,350 B2 | 9/2011 | Itoi et al. |
| 8,269,247 B2 | 9/2012 | Kim |
| 8,288,755 B2 | 10/2012 | Kim |
| 8,809,888 B2 | 8/2014 | Kim |
| 8,809,893 B2 | 8/2014 | Choi |
| 8,957,430 B2 | 2/2015 | Donofrio |
| 8,963,190 B2 | 2/2015 | Matsuda |
| 2002/0093024 A1 | 7/2002 | Lee |
| 2002/0093025 A1 | 7/2002 | Malone |
| 2004/0079871 A1 | 4/2004 | Oikawa |
| 2005/0009239 A1 | 1/2005 | Wolff et al. |
| 2005/0013562 A1 | 1/2005 | Tatehata et al. |
| 2005/0053336 A1 | 3/2005 | Ito et al. |
| 2005/0221518 A1 | 10/2005 | Andrews et al. |
| 2005/0221519 A1 | 10/2005 | Leung |
| 2007/0009223 A1 | 1/2007 | Rudmann et al. |
| 2007/0019409 A1 | 1/2007 | Nawashiro et al. |
| 2007/0152229 A1 | 7/2007 | Yoshida et al. |
| 2007/0268694 A1 | 11/2007 | Bailey |
| 2008/0068939 A1 | 3/2008 | Tanaka et al. |
| 2008/0230934 A1 | 9/2008 | Rudmann et al. |
| 2009/0059588 A1 | 3/2009 | Engl et al. |
| 2009/0101930 A1 | 4/2009 | Li |
| 2009/0251902 A1 | 10/2009 | Woo |
| 2011/0031510 A1 | 2/2011 | Rossi et al. |
| 2011/0043923 A1 | 2/2011 | Rossi et al. |
| 2011/0063722 A1 | 3/2011 | Shyu et al. |
| 2011/0220278 A1 | 9/2011 | Rudmann et al. |
| 2011/0293168 A1 | 12/2011 | Matsushima et al. |
| 2012/0001219 A1 | 1/2012 | Park |
| 2012/0032216 A1 | 2/2012 | Dong et al. |
| 2012/0138991 A1 | 6/2012 | Chuang et al. |
| 2012/0153306 A1 | 6/2012 | Yao |
| 2012/0280264 A1 | 11/2012 | Beeson et al. |
| 2013/0019461 A1 | 1/2013 | Rudmann |
| 2013/0033767 A1* | 2/2013 | Rudmann ........ B29D 11/00307 359/722 |

FOREIGN PATENT DOCUMENTS

| | | |
|---|---|---|
| JP | H03-33770 | 2/1991 |
| JP | H06-326828 | 11/1994 |
| JP | H06328778 | 11/1994 |
| JP | H08-234071 | 9/1996 |
| JP | 2000-025270 | 1/2000 |
| JP | 2007-134645 | 5/2007 |
| JP | 2007-524243 | 8/2007 |
| JP | 2009-212171 | 9/2008 |
| JP | 2011-059691 | 3/2011 |
| JP | 2011-507219 | 3/2011 |
| JP | 2011-508253 | 3/2011 |
| WO | WO 2005/083789 | 9/2005 |
| WO | WO 2009/067832 | 6/2009 |
| WO | WO 2009/076790 | 6/2009 |
| WO | WO2011156926 A1 * | 12/2011 |

\* cited by examiner

Fig. 18          Fig. 19

US 9,786,820 B2

OPTO-ELECTRONIC MODULE AND METHOD FOR MANUFACTURING THE SAME

CROSS-REFERENCE TO RELATED APPLICATION(S)

This application is a divisional of U.S. application Ser. No. 13/569,707, filed on Aug. 8, 2012, which claims the benefit of priority U.S. application Ser. No. 61/521,818, filed on Aug. 10, 2011. The disclosures of the prior applications are incorporated herein by reference.

TECHNICAL FIELD

The disclosure relates to the field of opto-electronics and more specifically to the packaging and manufacturing of opto-electronic components. More particularly, it relates to opto-electronic modules and to methods of manufacturing the same and to appliances and to electronic devices comprising such modules, in particular wherein the modules comprise a light emitter. The invention relates to methods and apparatuses according to the opening clauses of the claims.

DEFINITION OF TERMS

"Active optical component": A light sensing or a light emitting component. E.g., a photodiode, an image sensor, an LED, an OLED, a laser chip.

"Passive optical component": An optical component redirecting light by refraction and/or diffraction and/or reflection such as a lens, a prism, a mirror, or an optical system, wherein an optical system is a collection of such optical components possibly also comprising mechanical elements such as aperture stops, image screens, holders.

"Opto-electronic module": A component in which at least one active and at least one passive optical component is comprised.

"Replication": A technique by means of which a given structure or a negative thereof is reproduced. E.g., etching, embossing, imprinting, casting, molding.

"Wafer": A substantially disk- or plate-like shaped item, its extension in one direction (z-direction or vertical direction) is small with respect to its extension in the other two directions (x- and y-directions or lateral directions). Usually, on a (non-blank) wafer, a plurality of like structures or items are arranged or provided therein, typically on a rectangular grid. A wafer may have opening or holes, and a wafer may even be free of material in a predominant portion of its lateral area. Although in many contexts, a wafer is understood to be prevailingly made of a semiconductor material, in the present patent application, this is explicitely not a limitation. Accordingly, a wafer may prevailingly be made of, e.g., a semiconductor material, a polymer material, a composite material comprising metals and polymers or polymers and glass materials. In particular, hardenable materials such as thermally or UV-curable polymers are interesting wafer materials in conjunction with the presented invention.

"Lateral": cf. "Wafer"

"Vertical": cf. "Wafer"

"Light": Most generally electromagnetic radiation; more particularly electromagnetic radiation of the infrared, visible or ultraviolet portion of the electromagnetic spectrum.

BACKGROUND

According to a known way of manufacturing an opto-electronic module, a single packaged active optical component is arranged and aligned with respect to a single passive active optical component, and the components are fixed with respect to each other. U.S. Pat. No. 5,912,872 discloses an integrated optical apparatus including an optically transparent substrate with a light source and a detector mounted adjacent thereto. The substrate includes an optical element in a transmit path from the light source to a remote target. The optical element splits the light into more than one beam. The detector receives beams reflected by the target. All optical elements needed to create the more than one beam, direct the more than one beam onto the target and direct the more than one beam from the target to the detector are on the substrate and/or any structure bonded to the substrate. Ways of manufacturing integrated optical apparatuses on wafer level are disclosed.

SUMMARY

It is one object of the invention to create an alternative way of manufacturing opto-electronic modules. More particularly, a particularly fast way of manufacturing opto-electronic modules and/or a particularly simple way of manufacturing opto-electronic modules shall be provided. In addition, the respective opto-electronic module, an electronic device comprising such an opto-electronic module and an appliance comprising a multitude of such opto-electronic modules shall be provided.

Another object of the invention is to provide opto-electronic modules having a particularly good manufacturability and a corresponding manufacturing method.

Another object of the invention is to provide opto-electronic modules being manufacturable in a particularly low number of manufacturing steps and a corresponding manufacturing method.

Another object of the invention is to provide a way of manufacturing opto-electronic modules which is a particularly stable manufacturing process.

Another object of the invention is to provide a method for manufacturing opto-electronic modules which is a particularly well suitable for mass production.

Another object of the invention is to provide a method for manufacturing opto-electronic modules involving an improved handling, in particular a simplified handling.

Another object of the invention is to provide opto-electronic modules having a particularly accurate alignment and a corresponding manufacturing method.

Another object of the invention is to provide opto-electronic modules of particularly small dimensions.

Another object of the invention is to provide opto-electronic modules which are well protected against undesired emission of light out of the module and/or against undesired entry of light into the module.

Another object of the invention is to provide particularly small electronic devices comprising at least one opto-electronic module.

Further objects emerge from the description and embodiments below.

At least one of these objects is at least partially achieved by apparatuses and methods according to the patent claims.

GENERAL ASPECT(S) OF THE INVENTION

In a general aspect of the invention, the method is a method for manufacturing a device, the device comprising at least one opto-electronic module, said method comprising the step of c) creating a wafer stack comprising a first wafer, referred to as substrate wafer, and a second wafer, referred to as optics wafer;

wherein a multitude of active optical components is mounted on said substrate wafer, and said optics wafer comprises a multitude of passive optical components, and wherein each of said opto-electronic modules comprises at least one of said active optical components and at least one of said passive optical components.

Such a wafer-level manufacturing requires a very small number of manufacturing steps only. And in addition, the achievable alignment accuracy (in particular for the lateral alignment) is very high. Also, the achievable process stability is high. Such a method is very well suited for mass production.

Furthermore, it is possible to provide packaged opto-electronic modules which do not require further packaging before being used in an assembly. Already on wafer level, all necessary housing portions can be present, and the packaged opto-electronic packages including all their housing portions can be readily obtained carrying out a separating step (cf. step d) below).

The device can be, e.g., said opto-electronic module, but the device can also be said wafer stack. And, the device can be an apparatus comprising said opto-electronic module, e.g., an electronic device comprising said opto-electronic module, such as a smart phone, or a photographic device, e.g., a photo camera or a video camera.

At least if the device is said opto-electronic module or comprises one or two of said opto-electronic modules, the method typically comprises the step of d) separating said wafer stack into a multitude of said opto-electronic modules.

The separating (or dicing) can be accomplished by, e.g., by means of a mechanical tool such as a saw (dicing saw or wafer saw) or a punch cutter, or by means of a laser.

Usually, already on wafer level and also in each opto-electronic module, each of said active optical components is allocated with at least one of said passive optical components.

The active optical components can be packaged components, but it is also possible to provide that the active optical components are used in form of bare dies, i.e. in unpackaged form. The latter will usually allow to manufacture smaller opto-electronic modules.

In the manufacture of the optics wafer and/or in the manufacture of the substrate wafer, replication can be used. This can contribute to an efficient manufacture of opto-electronic modules.

In one embodiment of the general aspect of the invention, the method comprises the step of a) providing said substrate wafer;

and/or the step of b) providing said optics wafer.

In one embodiment of the general aspect of the invention, which may be combined with one or more of the before-addressed embodiments of the general aspect, the method comprises the step of e) placing said active optical components on said first wafer by means of pick-and-place.

This can be accomplished, e.g., using a pick-and-place machine. Pick-and-place is a fast process which can be carried out well on wafer level, providing a high placing accuracy.

In the general aspect of the invention, the opto-electronic module comprises a substrate member;

an optics member;

at least one active optical component mounted on said subtrate member;

at least one passive optical component comprised in said optics member;

wherein the optics member is directly or indirectly fixed to said substrate member.

In a particular embodiment, outer bounds of a vertical silhouette of the opto-electronic module (i.e. the outer boarders of a shape described by the opto-electronic module in a projection into a lateral plane) describe substantially a rectangular shape. This can effect an enhanced manufacturability (cf. also the separating step d) mentioned above).

The invention comprises opto-electronic modules with features of corresponding methods according to the invention, and, vice versa, also methods with features of corresponding opto-electronic modules according to the invention.

The advantages of the opto-electronic modules basically correspond to the advantages of corresponding methods, and, vice versa, the advantages of the methods basically correspond to the advantages of corresponding opto-electronic modules.

In the general aspect of the invention, the appliance comprises a multitude of opto-electronic modules according to the invention, wherein the appliance comprises a first wafer referred to as substrate wafer and a second wafer referred to as optics wafer, wherein the multitude of substrate members is comprised in said substrate wafer, and the multitude of optics members is comprised in said optics wafer.

In the general aspect of the invention, the electronic device comprises a printed circuit board (PCB) and an opto-electronic module according to the invention mounted on said printed circuit board. Such an electronic device can be, e.g., a hand-held communication device such as a smart phone. The device could also be a photographic device, such as a photo camera.

The general aspect of the invention can be combined with several more specific aspects of the invention which are discussed below.

First Aspect of the Invention

In a first aspect of the invention, said active optical components are light emitting components. More particularly, said electro-optical components are light emitting members, such as light emitting diodes (LEDs), lasers, organic LEDs (OLEDs), e.g., for emitting, at least prevailingly, visible light and/or infrared light. In particular, each of said opto-electronic modules comprises exactly one light emitting member.

In this first aspect of the invention, said first wafer will usually be provided with no other types of active optical components but with light emitting members, and accordingly, there will usually be no other type of active optical components comprised in said opto-electronic modules but light emitting members.

For example, the opto-electronic modules are flash modules, i.e. components for emitting light flashes such as used in photography, e.g., in compact photo cameras or in hand-held communication devices such as smart phones or hand-held communication devices. The manufactured device can, accordingly, also be an electronic device such as those named before. In case that the opto-electronic modules are flash modules, said light emitting members are usually high-intensity short-pulse light emitters such as LEDs used in today's photo cameras or smart phones. In particular, LEDs referred to as "high-brightness LEDs" can be used.

In this first aspect of the invention, the passive optical elements comprise or are usually lens members. And in many applications, exactly one lens member is provided in each of the opto-electronic modules. E.g., one lens, be it a diffractive or a refractive or a diffractive and refractive lens, will be comprised in each opto-electronic module, usually allocated with one light emitting member such as a high-intensity short-pulse light emitter. A lens member comprises at least one lens element, wherein it is possible that a lens member is comprised of two or more transparent parts.

Second Aspect of the Invention

In a second aspect of the invention, said optics wafer and said optics member, respectively, comprise at least one portion, referred to as non-transparent portion or blocking portion, which is at least substantially non-transparent for at least a specific wavelength range, and at least one other portion, referred to as transparent portion, which is at least substantially transparent for at least said specific wavelength range. Note that the term wavelength range does not imply that it is contiguous. Usually, said specific wavelength range is characteristic for at least a portion of said multitude of active optical components, in particular for all of said multitude of active optical components. E.g., in case of a detector as an active optical component, said specific wavelength range is the wavelength range of light detectable by the detector or a portion thereof, and in case of a light emitting component as an active optical component, said specific wavelength range is the wavelength range of light emittable by the light emitting component or a portion thereof. When referring to "transparent" or "non-transparent" in the present patent application, it is referred to such a wavelength range.

A blocking portion can hold (fix) one or more transparent portions and, at the same time, inhibit unwanted propation of light, e.g., by functioning as an aperture and/or by avoiding that light exits or enters the opto-electronic module along an undesired path; the latter in particular when the blocking portion forms a portion of a housing of the opto-electronic module.

It can well be sufficient to provide that an optics member comprises or even consists of one blocking portion and one transparent portion. An optics wafer, however, will usually comprise a multitude of transparent portions, typically one transparent portion per associated passive optical component, while it is possible to provide that one blocking portion is sufficient. It can be provided that an optics wafer comprises or even consists of one blocking portion and a multitude of transparent portions.

It can be provided that the addressed transparency and non-transparency, respectively, is due to the material of which said transparent portion and said blocking portion, respectively, are made.

In particular, said blocking portion can be made substantially of one material, e.g., a polymer material such as a cured curable epoxy resin. Particularly suitable materials for manufacturing said blocking portion are hardenable materials, like curable materials, wherein curing can be accomplished by heating or by irraditation with light, e.g., ultraviolet light, wherein heating will in many cases be more suitable than irradiation because of the non-transparent properties of the blocking portion.

The blocking portion can be manufactured, e.g., by means of replication, more particularly using embossing. This can be very efficient in terms of providing a stable manufacturing process suitable for mass production. In an exemplary replication process using embossing, a structured surface is embossed into a liquid, viscous or plastically deformable material (replication material), then the material is hardened, e.g., by curing using ultraviolet radiation or heating, and then the structured surface is removed. Thus, a replica (which in this case is an negative replica) of the structured surface is obtained. Suitable materials for replication are, e.g., hardenable (more particularly curable) polymer materials, e.g., epoxy resins, or other replication materials, i.e. materials which are transformable in a hardening step (more particularly in a curing step) from a liquid, viscous or plastically deformable state into a solid state. Replication is a known technique, cf., e.g., WO 2005/083789 A2 for more details about this.

It is possible to provide that said blocking portion (of said optics wafer and of said optics member) is embodied as a unitary part, in particular if formed by replication. This can be very efficient in terms of simplifying the manufacturing process.

The optics wafer and also the opto-electronic module can be designed such that each transparent portion is laterally enclosed by the (or a) blocking portion.

Each of the transparent portions of the optics wafer and of the optics members usually comprises one or several of the passive optical components, usually rather one.

Also in the manufacture of transparent portions, a replication step may be comprised, in particular in the manufacture of the passive optical components. Correspondingly, the transparent parts may, at least in part, be made of a hardened hardenable material, in particular of a cured curable material, e.g., a polymer material such as an epoxy resin.

The manufacture of the device, in particular of the wafer stack or of the opto-electronic module, may comprise the step of d) manufacturing said optics wafer;
   wherein step d) comprises the steps of
   d1) providing a precursor wafer substantially made of non-transparent material having openings in places where said transparent portions are supposed to be located;
   d5) producing in each of said openings at least one of said passive optical components, usually exactly one.

As mentioned before, the terms transparent and non-transparent refer to the above-mentioned specific wavelength range.

Steps d1) and d5) can contribute to a particularly efficient way of manufacturing said optics wafer.

The precursor wafer can comprise said at least one blocking portion. There are different ways of manufacturing a precursor wafer. One way of manufacturing the precursor wafer makes use of replication, e.g., as described above. This can be very efficient. When a hardening step is carried out during said replication, e.g., a curing step, this will rather be done by heating, because a non-transparency of the non-transparent material of the blocking portion may in many cases be accompanied by a non-transparency for radiation that would be used for accomplishing radiation hardening.

An alternative to replication is creating said openings by means of drilling or etching. If molding is used for manufacturing the precursor wafer, using molding, duroplastic injection molding can be a particularly suitable method for various applications.

There are at least two ways of producing the transparent portions and more particularly the passive optical components, i.e. to carry out step d5):

One can manufacture the transparent portions or at least the passive optical components as unitary parts, e.g., by replication, such that the passive optical components, e.g., lenses, are located in the openings of the precursor wafer. Ways of producing lenses in openings in a wafer by replication are disclosed, e.g., in US 2011/043923 A1.

Or, one can manufacture the transparent portions or at least the passive optical components as a part composed of at least two parts. Particularly interesting is to firstly manufacture a semi-finished part comprising transparent elements, one in each of the openings of the precursor wafer, wherein each of the transparent elements has two opposing at least approximately flat surfaces substantially perpendicular to the vertical direction.

Accordingly, step d) in that case comprises the step of
  d2) at least partially filling said openings with transparent material.

Typically, during step d2), said transparent material is in a liquid or viscous state, and subsequent to step d2), the step of
  d3) hardening said transparent material;
is carried out. In particular, wherein said hardening comprises curing.

Step d2) can be carried out using a dispenser. Therein, one or several of said openings can be filled at a time. An alternative to using a dispenser is using a squeegee process, e.g., like used in a screen-printing process.

A so-obtained semi-finished part typically is a wafer having no holes penetrating the wafer (or at least no holes penetrating the wafer in the regions where the transparent portions are). Depending on the shape of the precursor wafer, more particularly of corrugations or protrusions in vertical directions it has (as visible in a vertical cross-section), it is possible and may be useful to apply a polishing step to the so-obtained wafer before proceeding forming the passive optical components.

If steps d2) and d3) are carried out, step d5) may comprise the step of
  d55) producing said multitude of passive optical components by producing on each of said multitude of transparent elements at least one optical structure.

Usually, said at least one optical structure is provided for influencing, in particular for guiding light, more particularly for redirecting light. E.g., said optical structures may be or comprise lens elements, but prisms, mirrors and optical structures making use of total internal reflection (TIR) may be provided, too.

Step d55) can be carried out, e.g., using replication, e.g., using embossing, e.g., in a way as described in more detail above for blocking portions.

As will be appreciated, the second aspect of the invention can also be combined with the first aspect of the invention. This can, e.g., help to ensure that emitted light leaves an opto-electronic module only along desired paths.

Third Aspect of the Invention

The substrate wafer can be—at least in the region where said active optical components are mounted—non-transparent. But in a third aspect of the invention, said active optical components each have an optically active surface, and the substrate wafer is, at least in part, transparent, and the active optical components are mounted on the substrate wafer in such a way that their respective optically active surface faces said substrate wafer in a location where the substrate wafer is transparent. The term "transparent in part" refers again to the before-mentioned specific wavelength range. The optically active surface is a portion of the surface of an active optical component where light can enter the active optical component to be detected by the active optical component or from which light is emittable by the active optical component. The latter is usually the case when the opto-electronic module is a light emitter such as an LED, the former when the opto-electronic module is a detector such as a photo diode.

Such a wafer may be, e.g., a transparent plate such as a glass plate or a plate of transparent polymer material. For some applications, it can be useful if not the whole substrate is transparent, but only portions thereof. This can be useful for guiding light more precisely and for inhibiting undesired light propagation, e.g., for producing a better-defined light cone, or for detecting light from pre-defined directions of incidence only. E.g., the substrate wafer can be realized similarly to what has been described above in the second aspect of the invention for the optics wafer. All what has been described there concerning the optics wafer or its manufacture may apply to the substrate wafer of the third aspect. Therein, it is optional (and not required) that the substrate wafer comprises passive optical components. The substrate wafer can, e.g., be what has been described above as a precursor wafer, holes or openings in the substrate wafer allocated with optically active surfaces of the active optical components serving as transparent portions, non-transparent portions surrounding the holes or openings blocking light emitted by or detectable by the active optical components. Or, the substrate can, e.g., be what has been described above as semi-finished part, the transparent elements in the substrate wafer allocated with optically active surfaces of the active optical components serving as transparent portions, non-transparent portions surrounding the holes or openings blocking light emitted by or detectable by the active optical components.

It is possible that the substrate wafer is embodied as a printed circuit board (PCB) or as a printed circuit board assembly (PCBA). This would be a combination of the third with the fourth aspect of the invention (see below). The PCB or PCBA could, e.g., have holes, e.g., manufactured by drilling, which serve as transparent portions allocated with the optically active surface of the active optical components, and electrical connections could be provided between electrical contacts of the active optical components and electrical contacts of the PCB. Such an electrical connection may at the same time serve as a mechanical connection fixing the active optical components to the PCB, wherein possibly, further provisions may be present contributing to a fixture of the active optical components to the substrate wafer. The printed circuit board (PCB) material of which the PCB is substantially made (disregarding the metals) may, e.g., be a rigid or a flexible PCB material, a fiber-reinforced or not fiber-reinforced material, it may be epoxy-based such as FR4 or polyimide.

The active optical elements can be placed on the substrate wafer by means of pick-and-place, e.g., using a pick-and-place machine known in electronics industry.

It is possible to fix the active optical components to the substrate wafer, e.g., by bonding them thereto, e.g., by gluing, in particular using thermosetting and/or UV-curing glue. An electrical connection of the active optical components to the substrate wafer is no necessity, but an option. If, e.g., the active optical components are not electrically connected to the substrate wafer, it is possible to provide that electrical contacts of the active optical components are used as electrical contacts of the manufactured opto-electronic modules, or, e.g., another (additional, second) substrate wafer can be provided for electrically contacting the active optical components.

In the latter case, that additional (second) substrate wafer can provide for the electrical contacts of the opto-electronic module to be manufactured. It is to be noted that in some cases, e.g., when the electrical connection to the additional (second) substrate wafer is accomplished by soldering, the (lateral) positioning accuracy of the active optical components achievable by a suitable fixing to the first substrate wafer can readily be by far superior to the accuracy achievable by a fixing to the second substrate wafer. In such a case, the electrical connections to the second substrate wafer will usually be created after (or at least not before) creating the fixing to the first substrate wafer.

The additional (second) substrate wafer can, e.g., be a PCB or a PCBA. If, e.g., the footprint of the passive optical components is smaller than desired for the opto-electronic modules to be manufactured, the additional substrate wafer can thus be used for widening the footprint and provide a footprint desired for the opto-electronic module.

Details concerning electrical contacts of the opto-electronic modules and of possibilities to electrically contact the active optical components which may find application within the third aspect of the invention are given below in conjunction with the fourth aspect of the invention.

As will be appreciated, the third aspect of the invention can be combined with the first and/or with the second aspect of the invention.

It is readily understood that, although prevailingly, the wafers have been mentioned above, the same or similar considerations apply to the corresponding members of the opto-electronic modules and to the opto-electronic modules manufactured using the described wafers. This also applies to the text further below.

Fourth Aspect of the Invention

In a fourth aspect of the invention, an electrical connection is present between the active optical components and the substrate wafer. This allows to rewire the electrical connections of the active optical components using the substrate wafer. The substrate wafer can be, e.g., a PCB or PCBA. Usually, the substrate wafer will predominantly be made of non-transparent material; in conjunction with the third aspect of the invention, it is possible to provide transparent portions in the substrate wafer, e.g., in form of holes or openings in the substrate wafer.

The electrical connections between the active optical components and the substrate wafer can be accomplished by means of, e.g., through-hole technology or surface mount technology (SMT), in particular if the active optical components are provided as packaged components. But in particular if the active optical components are provided as bare dies, the electrical connections between the active optical components and the substrate wafer can be accomplished by means of, e.g., wire bonding or flip chip technology or using conductive glue or by means of a combination of at least two of these; e.g., electrically and mechanically connecting the bare die with its non-light-emitting side to the substrate wafer by means of conductive glue and creating an electrical connection between the opposite (light-emitting) side of the bare die to the substrate wafer by means of wire bonding.

The electrical contacts of the opto-electronic modules can, also in the other aspects of the invention, be provided, e.g., by contact pads with or without attached solder balls or by lead frame contacts. The electrical contacts of the substrate wafer can, also in the other aspects of the invention where they are present, be provided by, e.g., contact pads or through-holes.

Generally, the fourth aspect of the invention can be combined with the first and/or the second and/or the third aspect of the invention described above. With respect to the combination of a fully transparent substrate wafer (which is a possible embodiment of the third aspect) with the fourth aspect, it is to be noted that it is possible to provide transparent materials for accomplishing electrical contacts, e.g., transparent conductive oxides such as ITO (indium tin oxide), ZnO (zinc oxide) or $SnO_2$ (tin oxide).

In a combination of the fourth and the third aspect of the invention, it is possible to provide that there are two substrate wafers provided, as has already been mentioned above in conjunction with the third aspect of the invention. Therein, it is possible to provide that the active optical components are firstly placed on and (mechanically) fixed to a substrate according to the third aspect (being transparent or having transparent portions), and then the electric connection to a substrate according to the fourth aspect is accomplished. But it is also possible to reverse this order, i.e. to firstly place the active optical components on a substrate according to the fourth aspect and establish the electrical connections between the active optical components and that substrate, and then to (mechanically) fix the active optical components to the second (at least partially transparent) substrate. And it is even possible to place the active optical components on one of these substrates and then to establish both connections (the electrical to the one and the mechanical to the other substrate wafer) at substantially the same time, e.g., by heating, e.g., the heating curing a bonding material (for the—mechanical—connection to the substrate according to the third aspect) and also melting a solder paste or curing an electrically conductive glue (for the electrical connection to the substrate according to the fourth aspect).

In an embodiment in which the active optical components are connected to two substrate wafers, e.g., like described before, the active optical components will usually be arranged between these two wafers, i.e. that one substrate wafer to which the active optical components are merely mechanically fixed will be arranged on one side of the active optical components, usually on that side, towards which said optically active surfaces of the active optical components face, and the other substrate wafer (to which the active optical components are electrically connected) will be arranged on another side of the active optical components (usually on the side which is opposite to that side, to which said optically active surfaces of the active optical components face).

More generally, one can also provide that the (mechanical) fixture to the one substrate wafer (according to the third aspect of the invention) can be dispensed with, such that in a corresponding wafer stack, the active optical components are arranged between that substrate wafer and a substrate wafer according to the fourth aspect, being electrically connected to the latter. The electrical connection will usually also provide a mechanical connection to the respective substrate wafer, and it is also possible to provide that the electrical connection can be complemented by an additional mechanical fixing, e.g., by bonding of the active optical component to the substrate according to the fourth aspect of the invention.

Fifth Aspect of the Invention

In a fifth aspect of the invention, means are provided which ensure a well-defined (and usually also pre-defined)

distance between said substrate wafer and said optics wafer. A precise vertical arrangement of active and passive optical components is generally of importance for manufacturing quality opto-electronic modules. (Note that the lateral alignment is also important; but this can usually be well accomplished manufacturing on wafer-scale as is generally proposed in the present patent application.) More specifically, these means can be, at least in part, non-transparent, e.g., by being made substantially of a non-transparent material, wherein such a material can in particularly be a polymer material and/or a hardened hardenable material, such as a curable material, e.g., a curable epoxy resin. This can help to inhibit light propagation in undesired directions, similar as has been explained for the optics wafer with at least one blocking portion in conjunction with the second aspect of the invention.

Furthermore, the before-addressed means may form a part of a housing of the opto-electronic modules to be manufactured. This can greatly enhance and/or simply the manufacture of the opto-electronic modules, and it can in that case be particularly useful to provide the before-addressed (at least partial) non-transparency of the means.

There are at least three ways of providing such means. One is to provide that these means are provided in form of a wafer, referred to as spacer wafer, the spacer wafer being not identical with said substrate wafer or said optics wafer. Such a spacer wafer can substantially be made of a hardened hardenable material such as cured curable material, e.g., an epoxy resin. And such a spacer wafer may be manufactured using replication. Another way is to provide that these means constitute a portion of the optics wafer. This can help to minimize the number of manufacturing steps. This is as if optics wafer and spacer wafer were the same part, and/or, e.g., at least a portion of the spacer wafer (usually the complete spacer wafer) and at least a portion of the optics wafer form a unitary part. The third way is to provide that these means constitute a portion of the substrate wafer. Also this can help to minimize the number of manufacturing steps. This is as if substrate wafer and spacer wafer were the same part, and/or, e.g., at least a portion of the spacer wafer (usually the complete spacer wafer) and at least a portion of the substrate wafer form a unitary part. In case a spacer wafer is provided which is not identical with the optics wafer or with the substrate wafer, that spacer wafer can, of course, fulfill, in addition, further functions, such as the before-mentioned possibility to contribute to the (outer) housing of manufactured opto-electronic modules and to block undesired light propagation.

When during the manufacture of the optics wafer or of the substrate wafer, replication is used, this possibly can be useful and save manufacturing steps. E.g., a unitary part can be manufactured by means of replication which is made of, e.g., cured, non-transparent replication material and which forms at least one blocking portion (non-transparent portion) of the optics wafer or of the substrate wafer and also forms means for defining a distance (usually a vertical distance) between active optical components and passive optical components.

Sixth Aspect of the Invention

A sixth aspect of the invention refers to the order of manufacturing steps during manufacturing a device comprising at least one opto-electronic module, more particularly during manufacturing an opto-electronic module. It is suggested to firstly provide an optics wafer and means for ensuring a well-defined vertical distance between passive and active optical components, wherein these means or at least a portion thereof may be comprised in the optics wafer or may be a distinct part and in particular a unitary part, and/or wherein these means are a composed of two or more parts. Only when this wafer is provided or, if the optics wafer and said means comprise at least two separate parts, when the corresponding two or more wafers are provided and fixed with respect to each other, the active optical components are attached to or mounted on said means, usually individually, e.g., using a pick-and-place process, or wafer-wise, i.e. by attaching a wafer on which a multitude of active optical components are mounted.

This can make it possible to achieve a particularly high alignment precision of the active optical components with respect to the passive optical components.

This sixth aspect can be combined with one or more of the first to fifth aspect of the invention.

For example, a light-emitting opto-electronic module such as a flash module (cf. first aspect of the invention) is manufactured including the manufacture of an optics wafer which may be partially non-transparent (cf. second aspect of the invention), wherein a spacer wafer which may be substantially non-transparent (cf. fifth aspect of the invention) is provided and attached to the optics wafer, or the optics wafer comprises protrusions functioning like a spacer wafer.

Then, the active optical components are attached (usually mechanically and usually not electrically). This may be accomplished by pick-and-place of the active optical components onto the optics wafer or, if present, onto the spacer wafer. Or, the active optical components are attached by attaching to the optics wafer or to the spacer wafer another wafer, namely the substrate wafer, on which the active optical components are arranged, in which case the active optical components have previously been mounted on or attached to that additional wafer (substrate wafer).

Yet another possibilty to attach the active optical components is to attach to the optics wafer or, if present, to the spacer wafer, another wafer, namely the substrate wafer, and then, the active optical components are mounted on the substrate wafer, wherein it is also possible to carry out the steps of attaching the substrate wafer to the other wafer and of attaching the active optical components to the substrate wafer in one process step and therefore substantially simultaneously, e.g., by heating (such as in a reflow oven), the heating accomplishing a hardening or curing of bonding material such as glue and/or solder.

However the time sequence of attaching the substrate wafer and attaching the active optical components to the substrate wafer, the substrate wafer can be fully or partially transparent (cf. third aspect of the invention), and the active optical components can have an electrical connection to the substrate (cf. fourth aspect of the invention), e.g., the substrate being a PCB or PCBA, or no electrical connection between the active optical components and the substrate wafer is provided. In particular in the latter case, electrical contacts of the active optical components may also serve as electrical contacts of the opto-electronic module.

Thus, in the sixth aspect of the invention, the following method may be provided:

A method according to the general aspect of the invention, wherein the wafer stack comprises means for ensuring a well-defined distance between said active optical components and said passive optical components, the method comprising, in case said means are comprised in said optics wafer, the steps of f) providing said optics wafer, said optics wafer comprising, as said means, vertical protrusions for ensuring said well-defined distance between said active optical components and said passive optical components; and h) attaching said active optical components to said wafer stack;

wherein step h) is not carried out before step f) is carried out;

in case said means are not comprised in said optics wafer, the steps of g1) providing said optics wafer; and g2) providing, as said means, at least one spacer wafer for ensuring a well-defined distance between said active optical components and said passive optical components;

h') attaching said active optical components to said wafer stack;

wherein step h) is not carried out before steps g1) and g2) are carried out.

Further embodiments and advantages emerge from the dependent claims and the figures.

BRIEF DESCRIPTION OF THE DRAWINGS

Below, the invention is described in more detail by means of examples and the included drawings. The figures show schematically.

The reference symbols used in the figures and their meaning are summarized in the list of reference symbols. The described embodiments are meant as examples and shall not confine the invention.

DETAILED DESCRIPTION

Figure 1:
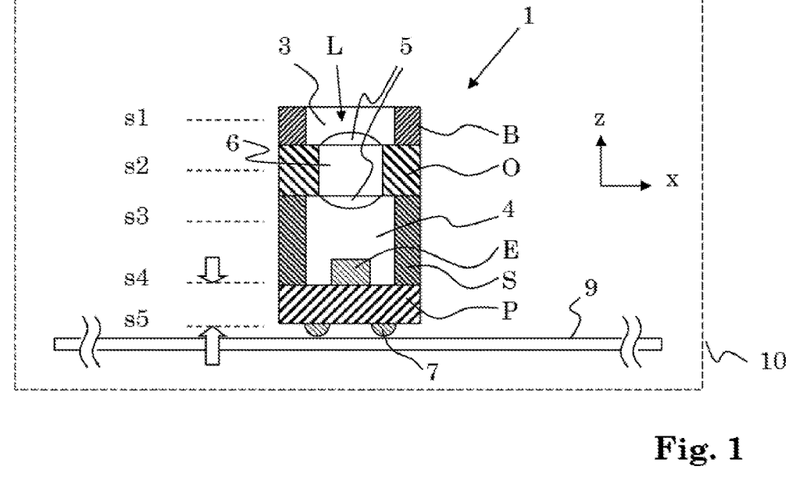
FIG. 1 a cross-sectional view of an opto-electronic module.
Figure 2:
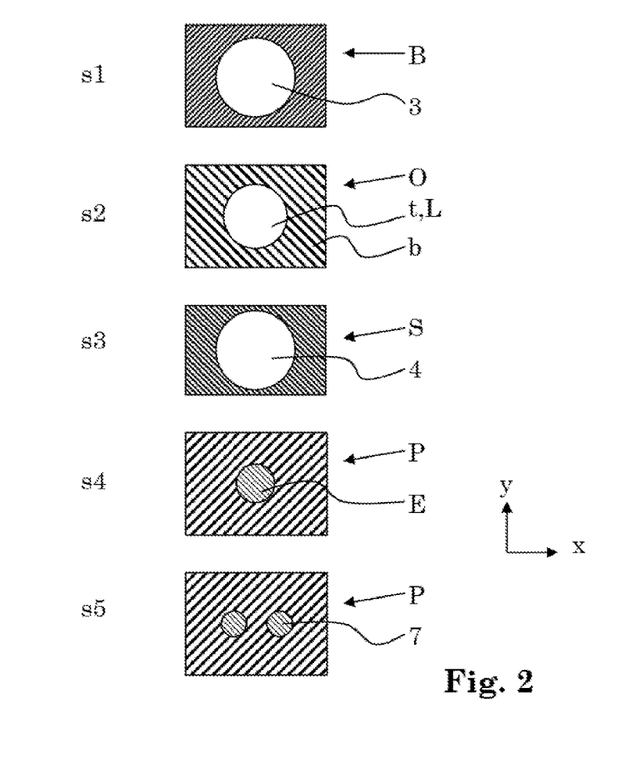
FIG. 2 various cross-sectional views of constituents of the module of FIG. 1.

FIG. 1 shows a schematic cross-sectional view of an opto-electronic module 1, e.g., a light-emitting module such as a flash light module like usable in photographic cameras or in smart phones. The illustrated cross-section is a vertical cross-section. FIG. 2 shows various schematic lateral cross-sectional views of constituents of the module of FIG. 1, wherein the approximate positions of these lateral cross-sections are indicated in FIG. 1 by s1 to s5 and dashed lines. For s4 and s5, the direction of view is indicated by arrows.

Module 1 comprises several constituents (P, S, O, B) stacked upon each other in a direction through which the term "vertical" is defined; it corresponds to the z direction (cf. FIG. 1). Directions in the x-y plane (cf. FIG. 2) perpendicular to the vertical (z) direction are referred to as "lateral".

Module 1 comprises a substrate member P, a spacer member S, an optics member O and a baffle member B stacked upon each other. Substrate member P is or comprises, e.g., a printed circuit board on which an active optical component E is mounted. The printed circuit board (PCB) can more specifically also be referred to as an interposer. The active optical component E can in particular be an emission member E for emitting light, in particular for emitting light flashes (high-intensity short light pulses), e.g., a light-emitting diode (LED). Electrical contacts of emission member E (not shown in FIG. 1) are electrically connected to the outside of module 1, where solder balls 7 are attached. Instead of providing solder balls 7, it would also be possible to provide contact pads at substrate member P, which are not or which are at a later time provided with solder balls or conductive glue.

This way, module 1 can be mounted on a printed circuit board 9, e.g., in surface mount technology (SMT), next to other electronic components (not shown). Printed circuit board 9 may be a constituent of an electronic device 10 such as a hand-held communication device or a photo camera. In particular, device 10 can be a smart phone. Module 1 is particularly suitable for such applications because it can be manufactured having a particularly small size.

Spacer member S has an opening 4 in which emission member E is arranged. Emission member E is laterally encircled by spacer member S.

Spacer member S may fulfill several tasks. It can ensure a well-defined distance between substrate member P and optics member O (through its vertical extension) which helps to achieve well-defined light paths from emitting member E through optics member O to the outside of module 1. Furthermore, spacer member S forms a portion of the outside walls of module 1. In particular if spacer member S is at least substantially non-transparent for light of a specific wavelength range, more particularly for light of wavelengths emittable by emission member E, it can help to inhibit an emission of light from portions of the module 1 from which an emission of light is undesired.

Typically, separating member S is made of a polymer material, in particular of a hardened hardenable or more specifically cured curable polymer material, e.g., of an epoxy resin.

Optics member O comprises a blocking portion b and a transparent portion t, the latter for allowing light emitted by emission member E to leave module 1.

Blocking portion b is substantially non-transparent for light of a specific wavelength range, in particular for light of the before-mentioned specific wavelength range, e.g., by being made of a suitable (polymer) material. Transparent portion t comprises a passive optical component L or, more particularly and as an example, a lens member each, for light guidance, more particularly for guiding light emitted by emission member E (in a desired way). Lens member L may, e.g., comprise, as shown in FIG. 1, two lens elements 5 in close contact to a transparent element 6. Transparent element 6 can have the same vertical dimension as optics member O where it forms blocking portion b, such that optics member O where it forms blocking portion b together with transparent element 6 describes a (close-to-perfect) flat solid plate shape. Lens element 5 redirects light by refraction (cf. FIG. 1) and/or by diffraction. E.g., lens element may be of generally convex shape (as shown in FIG. 1), but may be differently shaped, e.g., generally or partially concave.

Baffle member B, which is optional in opto-electronic module 1, allows to confine a cone of light emitted by the opto-electronic module 1; it may function as an aperture. But it may also serve to mechanically protect passive optical component L. Usually, baffle member B will have a transparent region 3 which may be embodied as an opening or by means of transparent material. Baffle member B can, outside transparent region 3, be made of a material substantially attenuating or blocking light having a wavelength in a specific or in one of the before-addressed wavelength range, or it could be provided with a coating having such a property, wherein the latter will usually be more complex to manufacture. The shape of baffle member B or more precisely of transparent region 3, can, of course, be different from what is shown in FIGS. 1 and 2, e.g., describe cone-like shapes or describe a truncated pyramid.

The lateral shape not only of transparent region 3, but also of transparent portion t and of opening 4 do not have to be circular, but may have other appearances, e.g., polygonal or rectangular with rounded corners.

Module 1 is an opto-electronic component, more precisely a packaged opto-electronic component. The vertical side walls of module 1 are formed by items P, S, O and B. A bottom wall is formed by substrate member P, and a top wall by baffle member B or by baffle member B together with optics member O.

As is well visible in FIG. 2, the four items P, S, O, B, which can for the reasons above also be referred to as housing components, all have substantially the same lateral shape and lateral dimensions. This is related to a possible and very efficient way of manufacturing such modules 1 which is described in more detail below referring to FIGS. 3 and 4. These housing components P, S, O, and B are all of generally block- or plate-like shape or more generally of generally rectangular parallelepiped shape, possibly having holes or openings (such as baffle member B and spacer member S do) or projections (such as optics member O does).

It is possible to provide modules which are designed according to the same principles as discussed above, but comprising, instead of or in addition to emission member E, one or more electric or electronic components, in particular active optical components, such as one or more additional light sources, or one or more integrated circuits, or a light detector.

The active optical components comprised in a module (such as emission member E in the example of FIG. 1) can be packaged or unpackaged electronic components. For electrically contacting substrate member P, technologies such as wire-bonding or flip chip technology or contacting using electrically conductive paste or glue, or also any other known surface mount technology may be used, or even conventional through-hole technology. More details and examples will be given below, in conjunction with other figures.

The typically envisaged dimensions of opto-electronic modules 1 described in the present patent application are laterally below 15 mm, more typically between 0.5 mm and 8 mm, more particularly between 1 mm and 5 mm, and vertically below 30 mm, more typically between 1 mm and 15 mm, more particularly between 1.5 mm and 10 mm. But generally, also other dimensions may be applicable.

Figure 3:
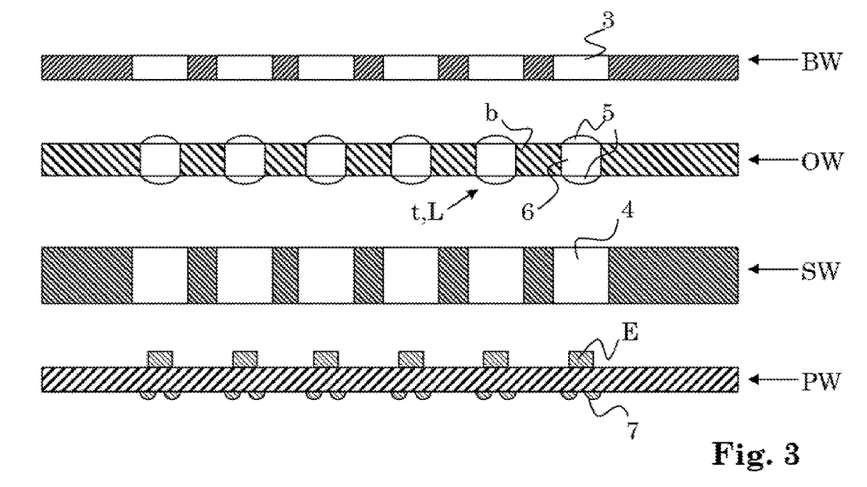
FIG. 3 a cross-sectional view of wafers for forming a wafer stack for manufacturing a multitude of modules of FIG. 1.

FIG. 3 shows a schematical cross-sectional view of wafers for forming a wafer stack for manufacturing a multitude of modules as shown in FIG. 1. It is possible to manufacture such modules 1 (practically) completely on wafer-scale, of course with a subsequent separation step. Although FIGS. 3 and 4 only show provisions for three modules 1, there will usually be in one wafer stack 2 provisions for at least 10, rather at least 30 or even more than 50 modules in each lateral direction. Typical dimensions of each of the wafers are: laterally at least 5 cm or 10 cm, and up to 30 cm or 40 cm or even 50 cm; and vertically (measured with no components arranged on substrate wafer PW) at least 0.2 mm or 0.4 mm or even 1 mm, and up to 6 mm or 10 mm or even 20 mm. But generally, also other dimensions may be applicable.

Four wafers are sufficient for manufacturing a multitude of modules as shown in FIG. 1: A substrate wafer PW, a spacer wafer SW, an optics wafer OW and a baffle wafer BW. Each wafer comprises a multitude of the corresponding members comprised in the corresponding module 1 (cf. FIGS. 1 and 2), usually arranged on a rectangular lattice, typically with a little distance from each other for a wafer separation step.

Substrate wafer PW can be embodied as a PCB of standard PCB materials, with a multitude of passive optical components E mounted thereon on one side, and provided with solder balls 7 on the other one side. The emission members E can be placed on substrate wafer PW by pick-and-place using standard pick-and-place machines well-known in electronics industry.

In order to provide maximum inhibition of light emission from undesired parts of module 1, each of the wafers PW, SW, OW, BW can substantially be made of a material substantially non-transparent for light emitted by emission members E, of course except for transparent areas such as transparent portions t and transparent regions 3.

Wafers SW and BW and possibly also all or a portion of wafer OW can be produced by replication. In an exemplary replication process, a structured surface is embossed into a liquid, viscous or plastically deformable material, then the material is hardened, e.g., by curing using ultraviolet radiation or heating, and then the structured surface is removed. Thus, a replica (which in this case is an negative replica) of the structured surface is obtained. Suitable materials for replication are, e.g., hardenable (more particularly curable) polymer materials or other replication materials, i.e. materials which are transformable in a hardening step (more particularly in a curing step) from a liquid, viscous or plastically deformable state into a solid state. Replication is a known technique, cf., e.g., WO 2005/083789 A2 for more details about this.

In case of optics wafer OW, replication using embossing or molding may be used for obtaining the non-transparent portions (blocking portion b). It would also be possible to provide holes, where transparent portions t are supposed to be, by means of drilling or etching.

Figure 7:
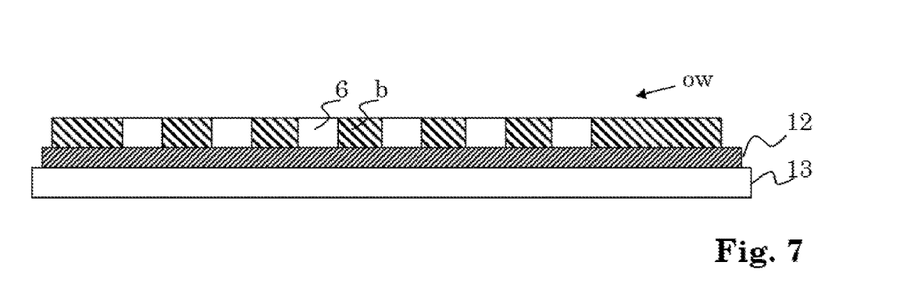
FIG. 7 a diagrammatical illustration of a manufacturing step in a cross-sectional view, a semi-finished part is shown.

Subsequently, a so-obtained precursor wafer is provided with lens members L, so as to yield optics wafer OW. This may be accomplished by means of replication, e.g., forming lens members L as a unitary parts, e.g., as described in US 2011/0043923 A1. The lens members L can, however, also be manufactured in a different way which will be described referring to FIGS. 5 to 9. FIGS. 5 to 8 are schematized diagrammatical illustrations of corresponding manufacturing steps, in a cross-sectional view, wherein FIG. 7 illustrates a semi-finished part referenced ow. FIG. 9 is a schematized diagrammatical illustration of a cross-section through a so-obtained optics wafer OW.

This particular way of manufacturing is based on semi-finished part ow shown in FIG. 7 being a wafer comprising transparent elements 6 within holes by which transparent portions t are defined. This can be particularly useful when lens members L each describe at least one apex, and those apices are located outside a vertical cross-section of the optics wafer OW. Such a semi-finished part ow is (usually, and in the exemplary case illustrated in the FIGS. 1-9) a flat disk-like wafer having no holes penetrating the wafer in the transparent portions t and having virtually no or only shallow surface corrugations, such surface corrugations usually being concave, i.e. not extending beyond the wafer surface as described by the blocking portions b.

A semi-finished part ow like that (cf. FIG. 7) can be obtained starting from a flat precursor wafer 8 (typically made of one material) having holes or openings 11 where the transparent portions t are supposed to be (cf. FIG. 5) and then filling the holes 11 with transparent material T, e.g., using a dispensing process (cf. FIG. 6), either filling the holes 11 in the precursor wafer 8 one-by-one, e.g., using a dispenser such as used for underfilling processes in flip-chip technology or the like, or by filling several holes 11 at once, e.g., using a squeegee process (e.g. as known from screen printing) or a dispenser with several hollow needles outputting material T.

During the dispensing (cf. FIG. 6), the wafer can be placed on a flat support, e.g. on a support layer 12, e.g., made of a silicone, which again sits on a support substrate 13, e.g., a glass plate, for reasons of stability. Care has to be taken order to prevent the formation of air bubbles or cavities in the dispensed material T, since this would degrade the optical properties of the lens members L to be produced. E.g., one can carry out the dispensing in such a way that wetting of the wafer material starts at an edge formed by the wafer and an underlying support layer 12 (or in a place close to such an edge), e.g., by suitably guiding a hollow needle outputting the material T close to such an edge. Subsequently, the dispensed material is cured, e.g., by heat or UV radiation, so as to obtain hardened transparent material. This yields the semi-finished part now shown in FIG. 7.

Convex meniscuses possibly formed this way can be flattened by polishing, so as to obtain a transparent element 6 having parallel surfaces adjusted to the wafer thickness wherein it is possible to carry out the polishing in such a way that the wafer thickness is reduced to a desired value. Then, by means of replication, lens elements 5 are applied to one or both sides (top and bottom side) of semi-finished part ow.

Figure 8:
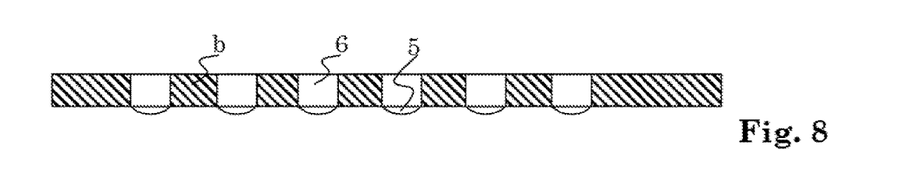
FIG. 8 a diagrammatical illustration of a manufacturing step in a cross-sectional view.
Figure 9:
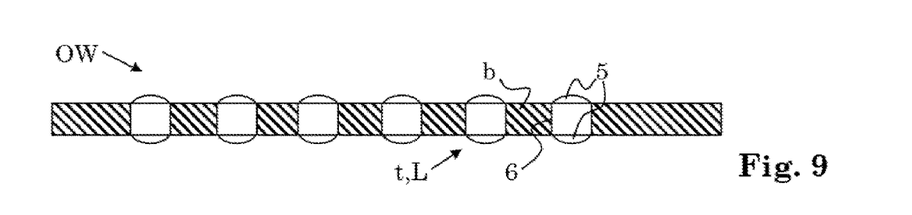
FIG. 9 a diagrammatical illustration of a cross-section through an optics wafer.

FIG. 8 illustrates the state after adding lens elements 5 on one side only. In case of concave meniscuses of the transparent elements, the replication can take place on these, wherein the amount of applied replication material might have to be adjusted accordingly. Alternatively, polishing may be used, wherein during polishing, not only surfaces of transparent elements 6 are flattened, but also the blocking portion b.

FIG. 9 illustrates an optics wafer OW as obtained in the before-described way, with lens elements 5 added on both sides.

In many cases, it is possible to combine the functionality of two or more wafers which would be adjacent in the wafer stack in one single wafer ("combined wafer"). E.g., a suitably designed optics wafer can replace the following wafers shown in FIGS. 3 and 4: wafers OW and SW; or wafers OW and BW; oder wafers BW, OW and SW.

Accordingly, it is possible to provide that said spacer wafer SW is obsolete in the sense that a particular kind of optics wafer is provided which functionally replaces the spacer wafer SW. An optics wafer ("combined optics wafer") can be provided which incorporates the features and functionalities of said spacer wafer SW. Producing such a "combined optics wafer" may be accomplished using a particular precursor wafer and, manufactured based thereon, a particular semi-finished part. Such a precursor wafer and semi-finished part, respectively, has at least one structured surface, usually having protrusions extending vertically beyond at least one of the two surfaces of transparent elements 6 to be provided in the precursor wafer and present in the semi-finished part, respectively.

Figure 10:
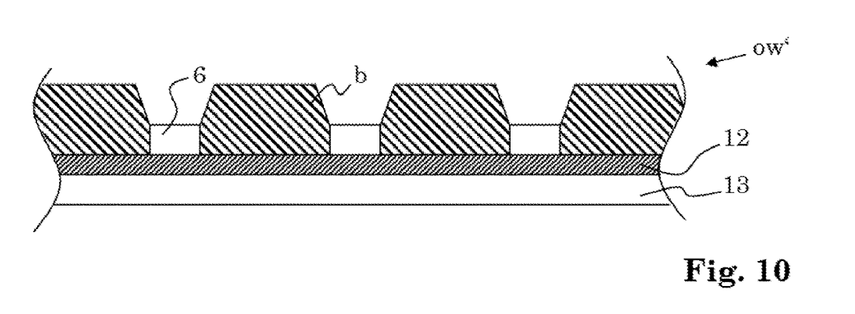
FIG. 10 a cross-sectional view of a semi-finished part having a structured surface.

In FIG. 10, an example of a such a semi-finished part ow' ("combined semi-finished part") with one structured surface is schematically illustrated. It is readily deduced from FIG. 10, what a semi-finished part could look like when it would be used for manufacturing a module shown in FIG. 1. Looking upon wafers OW and SW (or wafers OW and BW, or wafers OW and SW and BW) in FIG. 4 as one single part, it can be readily visualized what a corresponding optics wafer ("combined optics wafer") for manufacturing a module according to FIG. 1 and also a corresponding semi-finished part would look like.

As mentioned before, analogously, a provision of other "combined wafers" is possible, e.g., such that an optics wafer is structured on both sides, so as to replace baffle wafer BW and spacer wafer SW.

Figure 4:
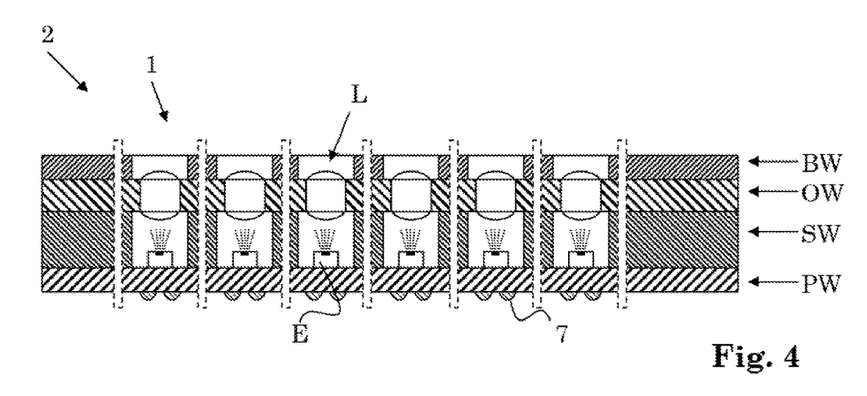
FIG. 4 a cross-sectional view of a wafer stack for manufacturing a multitude of modules of FIG. 1.
Figure 5:
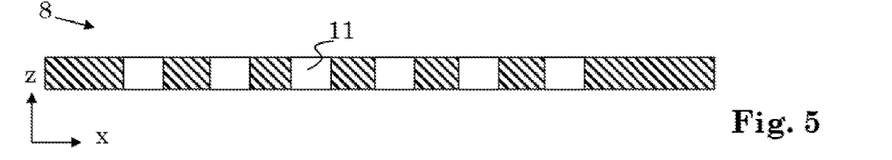
FIG. 5 a diagrammatical illustration of a manufacturing step in a cross-sectional view.
Figure 6:
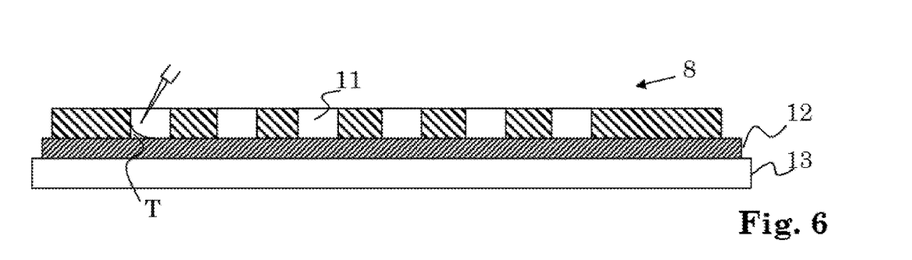
FIG. 6 a diagrammatical illustration of a manufacturing step in a cross-sectional view.

Coming back to FIG. 4: In order to form a wafer stack 2, the wafers are aligned and bonded together, e.g., by gluing, e.g., using a heat-curable epoxy resin. It is usually a critical point to ensure that each active optical component (such as the emission members E on the substrate wafer PW) is sufficiently accurately arranged with respect to a corresponding passive optical component (such as lens members L of the optics wafer OW).

FIG. 4 shows a cross-sectional view of a so-obtained wafer stack 2 for manufacturing a multitude of modules 1 as shown in FIG. 1. The thin dashed rectangles indicate where separation takes place, e.g., by means of using a dicing saw.

The fact that most alignment steps are carried out on wafer level makes it possible to achieve a good alignment (in particular of members E with respect to members L) in a rather simple and very fast way. The overall manufacturing process is very fast and precise. Due to the wafer-scale manufacturing, only a very small number of production steps is required for manufacturing a multitude of modules 1. High accuracy is readily achieved, e.g., the wafers to be combined in the wafer stack are manufactured, the emission members E are mounted using pick-and-place, and then, in one single alignment step, all active (E) and passive (L) optical components are (laterally) aligned with respected to each other, wherein the vertical alignment is taken care of by a spacer wafer SW or by a suitably designed optics wafer OW or substrate wafer PW.

In the embodiments described referring to FIGS. 1 to 10, several aspects of the invention (cf. section "Background of the Invention") are realized. The first aspect of the invention is realized, since a light-emitting module is realized, the second aspect, since the optics wafer OW is partially transparent and partially non-transparent (transparent portions t and blocking portions b), and the fourth aspect, since the substrate wafer is a PCB or PCBA.

Figure 11:
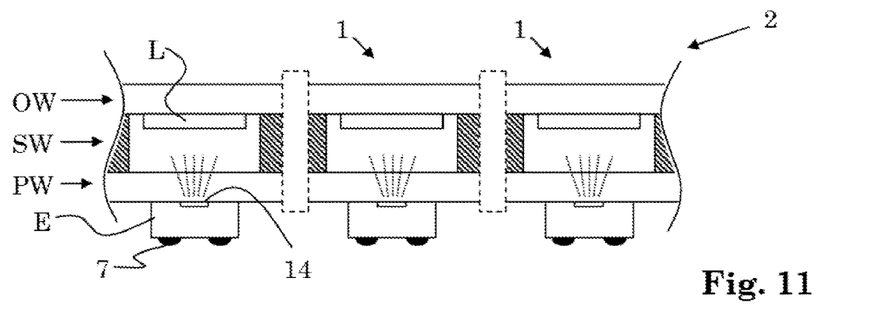
FIG. 11 a cross-sectional view of a wafer stack illustrating the manufacture of opto-electronic modules.

FIG. 11 schematically illustrates the manufacture of other opto-electronic modules 1 and shows a wafer stack 2, the thin dashed rectangles indicating where separation takes place. A transparent optics wafer OW is provided, and the passive optical components L are only very schematically sketched. E.g., the optical components L could be produced on a glass or transparent polymer plate, e.g., by replication, e.g., using embossing. Such an optics wafer may be looked upon as a transparent portion with no blocking portion.

A non-transparent spacer wafer, e.g., manufactured using replication, e.g., using embossing, and a transparent substrate wafer, e.g., a glass plate or a polymer-based plate, are provided. Either before wafer stack 2 is formed of wafers OW, SW, PW or after that, active optical components E such as LEDs are (mechanically) attached, usually by bonding, e.g., by gluing. Attaching the active optical components E is certainly carried out before separating wafer stack 2 into individual opto-electronic modules 1, i.e. is carried out on wafer level, because this way, the handling is simplified, and a high (lateral) alignment precision can be achieved relatively easily.

Optically active surfaces 14 of the active optical components E face substrate wafer PW, and light emitted by them (illustrated by dotted lines) runs through substrate wafer PW. Electrical contacts of the opto-electronic modules 1 are formed by electrical contacts of the active optical components E. The electrical contacts may be, as illustrated in FIG. 11, solder balls 7, but could also be contact pads or be formed by a lead frame of the active optical components E or provided differently.

Thus, in the embodiment of FIG. 11, the first and third and fifth and sixth aspects of the invention are combined. It would also be possible to provide that optics wafer OW is partially non-transparent, e.g., like shown in FIGS. 3 and 4 (cf. also FIGS. 5 to 9), and thus include also the second aspect of the invention.

Using the electrical contacts of the active optical components E as contacts of the opto-electronic modules 1 will usually not allow to include the fourth aspect of the invention in the illustrated embodiment. However, a partially non-transparent substrate wafer PW could be provided, e.g., based on what has been described above as semi-finished part ow (cf. FIG. 7), manufactured, e.g., like illustrated in FIGS. 5 to 7. Alternatively, a partially non-transparent substrate wafer PW could be provided similar to what has been described before as precursor wafer 8 (cf. FIG. 5).

In particular if at least one of substrate wafer PW and optics wafer OW is partially transparent and partially non-transparent, spacer wafer SW could be replaced by one of these, by combining the functionalities of the respective two wafers (OW and SW, or PW and SW) in one wafer.

When both, substrate wafer PW and optics wafer OW, are partially transparent and partially non-transparent, and with spacer wafer SW, if present, non-transparent, opto-electronic modules 1 can be manufactured from which light is emitted only in desired, well-defined ways, more particularly only through desired transparent parts such as through the passive optical components L.

FIGS. 12 to 19 show opto-electronic modules 1 in which the first and the fourth and the sixth aspects of the invention is realized, whereas the third aspect is not realized therein and usually will not need be realized therein. In these embodiments, PCBs or interposers can be used as substrate members P, the electrical contacts of the active optical components E, however realized, being reroutable by the substrate member P, and the electrical contacts of the opto-electronic modules 1 being realized by the substrate members P, realized, e.g., as contact pads without solder balls or, as shown in the Figures, with solder balls 7. The modules 1 may, as an example, be understood as light-emitting modules such as flash modules like usable in photographic cameras or in smart phones, the active optical components E thus being light emitters such as LEDs. Although the passive optical components L are mostly only very schematically sketched in the Figures and sometimes more explicitly drawn, they may by any passive optical component or any combination of any passive optical components. For many typical applications, lenses will be used, wherein these may be diffractive and/or refractive lenses, and they may be unitary parts or be comprised of two or more parts (e.g., as shown in FIGS. 1, 2 and 4).

From the descriptions of the wafer-level based manufacturing process given above, it will be clear, how the embodiments described below can be manufactured.

Figure 12:
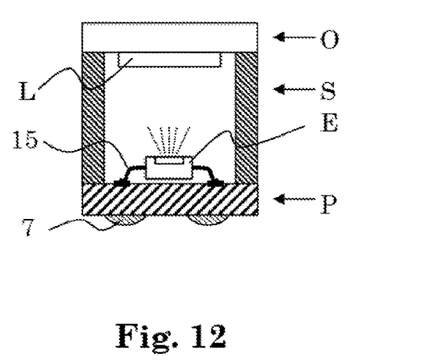
FIG. 12 an opto-electronic module in a cross-sectional view.

FIG. 12 illustrates an opto-electronic module 1 comprising an active optical component E which is realized as a lead-frame package (lead frame 15) and mounted on substrate member P. Substrate member P and optics member O are fixed with respect to each other by spacer member S adjusting the vertical distance between active optical component E and passive optical component L. Optics member O can be realized, e.g., as described above in conjunction with FIG. 11. With spacer member S being non-transparent, also the fifth aspect of the invention is realized in this example.

Figure 13:
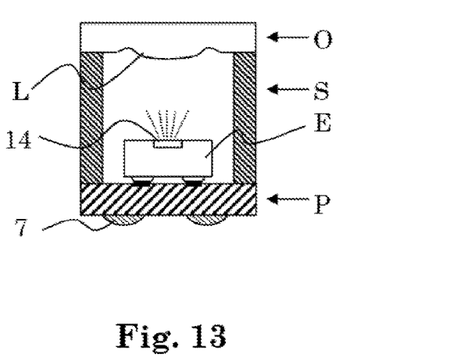
FIG. 13 an opto-electronic module in a cross-sectional view.

FIG. 13 illustrates a similar opto-electronic module 1 as FIG. 12, but here, the active optical component E is electrically contacted using soldering from the back side, i.e. from that side of the active optical component E opposite to its optically active surface 14. Active optical component E can be a packaged component or a bare die. Furthermore, FIG. 13 illustrates that passive optical components L may be embodied in various ways, having any suitable shape for suitably guiding light, in particular light emitted by active optical component E.

Figure 14:
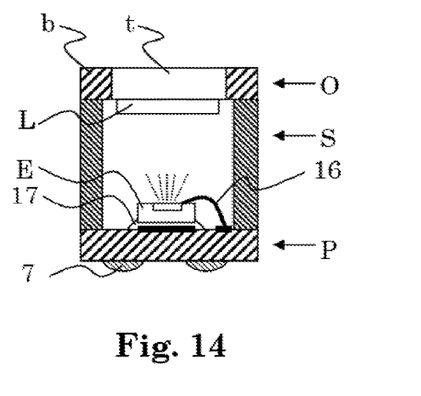
FIG. 14 an opto-electronic module in a cross-sectional view.

FIG. 14 illustrates a similar opto-electronic module 1 as FIGS. 12 and 13, but here, the second aspect of the invention is realized by the partially non-transparent optics member O having a blocking portion b and a transparent portion t, e.g., like shown in FIGS. 1 and 2. Similarly, the second aspect can also be realized in the embodiments of FIGS. 12 and 13.

Furthermore, in FIG. 14, another way of electrically contacting a bare-die active optical component E, namely using wirebonding (wirebond 16) and electrically conductive glue 17. One can, e.g., and as shown in FIG. 14, electrically contact the front side of the active optical component E (from where light is emitted) by means of wire bond 16 while electrically contacting the back side by means of conductive glue 17. Both contacts may be directed to contact pads of the PCB or interposer which makes up for the substrate member P.

Including an unpacked (bare die) active optical component E in a module 1 can allow to realize particularly small modules 1.

Figure 15:
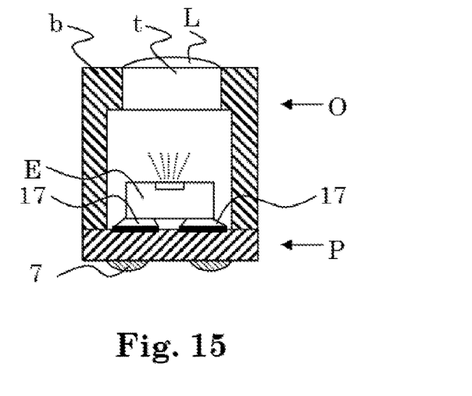
FIG. 15 an opto-electronic module in a cross-sectional view.

FIG. 15 illustrates a similar opto-electronic module 1 as FIGS. 12 to 14, but the optics member O also has the functionality of a spacer wafer. This may also be realized in embodiments of FIGS. 12 to 14. Manufacturing steps and alignment steps may be saved this way, and corresponding modules can be particularly small. Furthermore, it is illustrated in FIG. 15 that an active optical component E (packaged or unpackaged) may be electrically contacted using (solely) conductive solder 17. Furthermore, the passive optical component L is more explicitly drawn as a lens, and in particular as a protruding lens, wherein such kind of passive optical components L may be realized also in others of the described embodiments. The second aspect of the invention is also realized in the embodiment of FIG. 15, since the optics member O comprises a transparent portion t and a blocking portion b.

Figure 16:
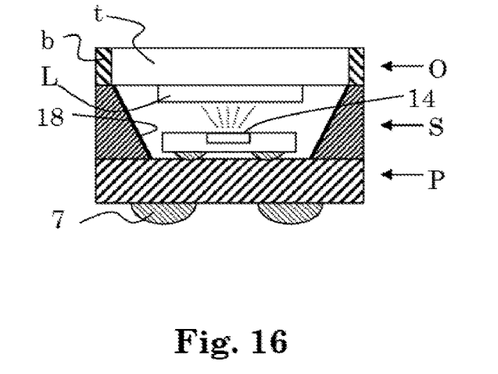
FIG. 16 an opto-electronic module in a cross-sectional view.

FIG. 16 illustrates an opto-electronic module 1 in which a coated spacer member S is comprised. The spacer member S comprises a reflective coating 18, e.g., obtained by applying one or more metal layers thereon, e.g., by exposing it to a suitable metal-containing vapor or by sputtering a metal such as aluminium. Alternatively, a dielectrical coating, in particular a reflective dielectrical coating, could be applied. As to the way of applying a coating, besides deposition out of the vapor phase, e.g., dip coating may be employed. The coating can enhance the optical properties of module 1 and/or be applied for achieving a particular effect for a person looking at the module (through optics member O). In particular, those surfaces of the spacer member S are partially or fully coated which face the inside of module 1. Furthermore, these surfaces may be, as shown in FIG. 16, inclined with respect to the vertical direction and more particularly describe a cone.

Spacer member S can be made substantially of a non-transparent material, e.g., manufactured by means of replication and subsequent coating, but it could also be made substantially of a transparent material, because the coating, if fully applied, may inhibit an emission of light through the spacer member S.

Because of the provision of transparent portion t and blocking portion b, module 1 embodies the second aspect of the invention. Ways of realizing this have been described herein before. But a fully transparent optics member O could also be provided. A bare-die active optical component E is in electrical contact with a PCB substrate member P by means of solder. Alternatively, one of the other ways of attaching and electrically contacting the active optical component E (packaged or unpackaged) described herein may be used. For strengthening the mechanical contact between active optical component E and substrate member P, an underfiller such as a suitable epoxy may be applied between the two (not shown).

Figure 17:
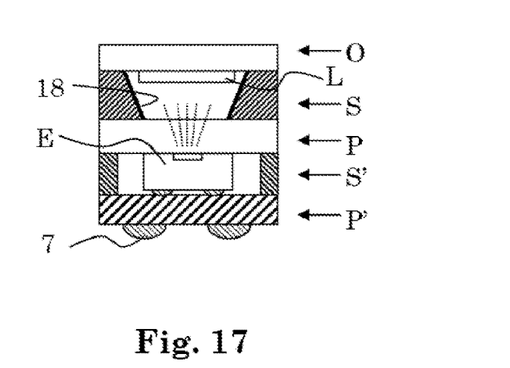
FIG. 17 an opto-electronic module in a cross-sectional view.
Figure 18:
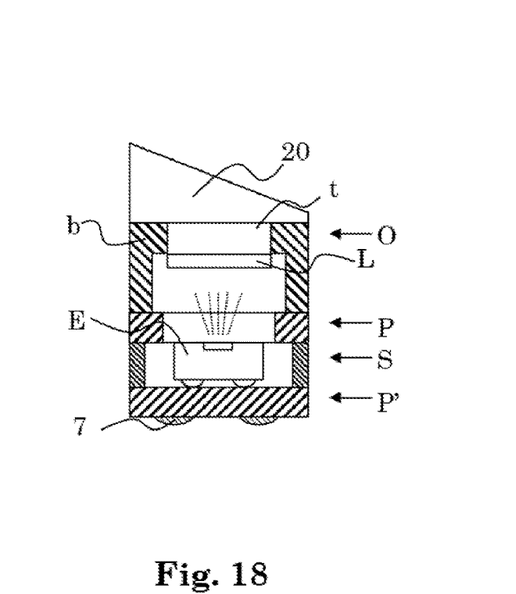
FIG. 18 an opto-electronic module in a cross-sectional view.
Figure 19:
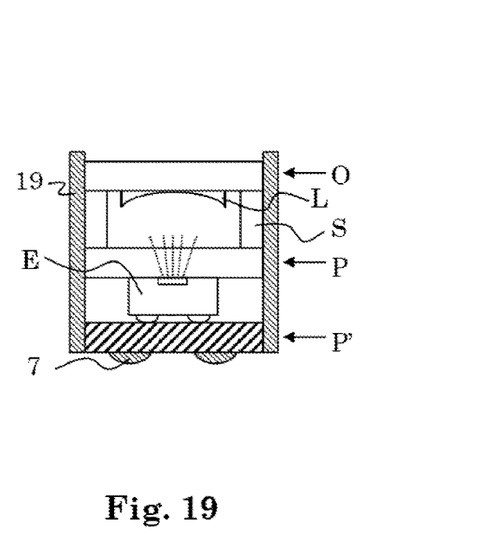
FIG. 19 an opto-electronic module in a cross-sectional view.

FIGS. 17 to 19 schematically illustrate further embodiments of opto-electronic modules. In the embodiments of FIGS. 17 to 19, the modules 1 comprise two substrate members P, P'. Active optical component E is (mechanically) fixed to substrate member P which is at least partially transparent, e.g., a glass or a polymer plate, and electrically connected to substrate member P', e.g., a PCB. Usually, the active optical component will be electrically contacted after having been mechanically fixed to substrate member P, or this electrically contacting is accomplished in one process with the mechanical fixing, e.g., in a reflow process. But it is also possible to firstly establish the electrical connection to substrate member P' and subsequently accomplish the mechanical fixture to substrate member P. Either way, usually, the active optical components will be placed on the one or the other wafer (P or P') by pick-and-place onto the respective wafer before the wafer stack 2 is formed.

When considering substrate wafer S', the fourth aspect of the invention is embodied in FIGS. 17 to 19, wherein substrate wafer S' usually will not embody the third aspect of the invention. On the other hand, when considering substrate wafer S, the third aspect of the invention is embodied in FIGS. 17 to 19, wherein substrate wafer S usually will not embody the fourth aspect of the invention.

The active optical components may be packaged or unpackaged. They may be electrically contacted in any of the described ways, wherein wirebonding to the top surface (facing substrate member P) is expected to render the realization of a well-defined and reproducible distance of the active optical component E to the optics member O difficult.

In FIG. 17, it is illustrated that two spacer members S, S' can be provided, spacer member S ensuring a desired vertical distance between substrate member P (and thus active optical component E) and optics member O. Spacer member S may be coated like discussed in conjunction with FIG. 16 and/or may be shaped as discussed in conjunction with FIG. 16. The other spacer member S' is arranged between the two substrate wafers P, P'. It increases a mechanical stability of module 1 and can in particular lead to an increased lifetime of the module by absorbing mechanical (including thermo-mechanical) stress to which the electrical connection between active optical component E and substrate member E is exposed. In embodiment with (at least) two substrates (P, P'), it can lead to an increased (lateral) alignment accuracy if the electrical connection of the active optical components E to the one substrate wafer (P' in FIG. 17) is created after the active optical components E have been (placed on and) fixed to the other substrate wafer (P in FIG. 17).

In a module 1 with two substrate members P, P', at least one spacer member may be replaced by a correspondingly designed other member, namely a substrate member P or P' or, as illustrated in FIG. 18, by a correspondingly designed optics member O. And/or one spacer member (S') can be dispensed with without a replacement, as illustrated in FIG. 19, wherein in the embodiment of FIG. 19, a tube-shaped sleeve or outer jacket 19 is applied individually to each module after separation. A similar circumferential outer cover may also be applied to any of the other described embodiments. Such a cover can be made of a non-transparent material, and in that case, efforts to create non-transparent portions in members which have to be at least partially transparent (such as P and O) can be dispensed with, see, e.g., substrate member P and optics member O in FIG. 19.

A module 1 as illustrated in FIG. 19 can be obtained like a module 1 illustrated in FIG. 11, wherein (usually before separating) a (second) substrate wafer such as a PCB is included in the wafer stack 2. And after separation, to each module 1, a sleeve 19 is attached, e.g., by sliding or shifting in a vertical direction.

In FIG. 19, another exemplary embodiment of a passive optical component L is illustrated, namely a concave lens, which may be used in other embodiments described herein, and, vice versa, in a module according to FIG. 19, also other passive optical components may find application, e.g., one of those discussed above.

In FIG. 18, it is illustrated that all members of a module 1 may be designed in such a way that all side walls of the module are made of non-transparent material. This helps to restrict the places where light may leave the module 1, and a particular (usually dark) outer appearance of the module can be achieved.

Furthermore, FIG. 18 illustrates an opto-electronic module 1 comprising a prism 20. Such prisms 20 and also differently-shaped fully transparent or in-part-transparent parts or elements forming a top of an opto-electronic module may be manufactured on wafer-level. E.g., molding may be used for manufacturing a corresponding wafer, wherein a transparent polymer or a glass may be used (for the polymers in particular injection molding), but such a wafer could also be manufactured using replication. It is also possible, in particular in case of glass, to manufacture a corresponding wafer using one or more polishing processes.

It is to be noted that for wafers (and corresponding members) which have been described above and which are non-transparent or comprise at least one non-transparent portion, not only polymer materials may find application, but it would be possible to manufacture the non-transparent parts of a metal material, e.g., of a molded metal, possibly of a polished metal. A metal may provide a particularly good dimensional stability and mechanical stability. E.g., a precursor wafer such as precursor wafer 8 shown in FIG. 5 might be embodied as a metal wafer. But polymer wafers will in many cases be lighter and cheaper.

Opto-electronic modules 1 described in the present patent application can have an excellent manufacturability while being very small in dimension and having a high alignment accuracy and thus a high quality.

LIST OF REFERENCE SYMBOLS 1 device, opto-electronic module, light-emitting module, LED module, flash light module
2 device, appliance, wafer stack
3 transparent region
4 opening
5 optical structure, lens element
6 transparent element
7 solder ball
8 precursor wafer
9 printed circuit board
10 device, electronic device, smart phone
11 hole, opening
12 support layer
13 support substrate
14 optically active surface
15 lead frame
16 wire bond, wire-bonding wire
17 electrically conductive glue
18 coating, reflective coating
19 sleeve, tube, jacket, cover
20 passive optical component, prism
b blocking portion, non-transparent portion
B baffle member
BW baffle wafer
D detecting member, detector, photo diode
E active optical component, emission member, light emitter, light-emitting diode
L passive optical component, lens member
O optics member
ow semi-finished part
ow' semi-finished part, "combined semi-finished part"
OW optics wafer
P substrate
P' substrate
PW substrate wafer
s1, s2, . . . refers to a sectional view
S spacer member
S' spacer member
SW spacer wafer
t transparent portion
T transparent material

What is claimed is:

1. A method for manufacturing a device, the device comprising at least one opto-electronic module, the method comprising:
creating a wafer stack comprising a first wafer, referred to as substrate wafer, and a second wafer, referred to as optics wafer, wherein a multitude of active optical components is mounted on the substrate wafer, wherein electrical connections between the active optical components and the substrate wafer are present based on one or more of through-hole technology, surface mount technology, wire bonding, flip chip technology, and/or conductive glue; and wherein the optics wafer comprises a multitude of passive optical components, and wherein each of the opto-electronic modules comprises at least one of the active optical components and at least one of the passive optical components, and wherein the optics wafer comprises at least one portion, referred to as blocking portion, which is non-transparent for at least a specific wavelength range, and at least one other portion, referred to as transparent portion, which is non-transparent for at least said specific wavelength range,
wherein the method further comprises manufacturing the optics wafer, and wherein manufacturing the optics wafer comprises:
providing a precursor wafer substantially made of non-transparent material having openings in places where the transparent portions are to be located;
at least partially filling the openings with transparent material;
hardening the transparent material; and
producing the passive optical components comprising producing on each of the multitude of transparent elements at least one optical structure.

2. The method according to claim 1, comprising:
placing said active optical components on said substrate wafer by the aid of pick-and-place.

3. The method according to claim 1, wherein the wafer stack comprises a spacer construction for ensuring a well-defined distance between said active optical components and said passive optical components,
wherein, in case said spacer construction is comprised in said optics wafer, the method includes:
(i) providing said optics wafer, said optics wafer comprising, as said spacer construction, vertical protrusions for ensuring said well-defined distance between said active optical components and said passive optical components; and
(ii) attaching said active optical components to said wafer stack;
wherein (ii) is not carried out before (i) is carried out; and
wherein, in case said spacer construction is not comprised in said optics wafer, the method includes:
(iii) providing said optics wafer; and
(iv) providing, as said spacer construction, at least one spacer wafer for ensuring a well-defined distance between said active optical components and said passive optical components;

(v) attaching said active optical components to said wafer stack;

wherein (v) is not carried out before (iii) and (iv) are carried out.

4. The method according to claim 1, wherein said active optical components are light emitting components, and wherein each of said opto-electronic modules comprises exactly one of said light emitting components.

5. The method according to claim 1, wherein said substrate wafer substantially in full is transparent for at least a specific wavelength range or comprises one or more portions in which it is transparent for at least a specific wavelength range.

6. The method according to claim 1, comprising:
establishing an electrical connection between each of said active optical components and said substrate wafer.

7. The method according to claim 1, wherein said substrate wafer is a printed circuit board or a printed circuit board assembly.

8. The method according to claim 1, wherein the wafer stack comprises a spacer construction for ensuring a well-defined distance between said active optical components and said passive optical components, wherein said spacer construction is comprised in said optics wafer or comprised in said substrate wafer or are distinct from these, wherein said spacer construction is, at least in part, made substantially of a material which is non-transparent for at least a specific wavelength range.

9. The method according to claim 1, wherein said active optical components are provided as bare dies.

10. The method according to claim 1, comprising:
separating said wafer stack into a multitude of said opto-electronic modules, each comprising at least one of said passive optical components and, vertically and optically aligned thereto, at least one of said active optical components.

11. The method according to claim 1, comprising:
manufacturing at least a portion of said optics wafer using of replication.

12. The method according to claim 1, comprising:
manufacturing said passive optical components using of replication.

13. The method according to claim 1, wherein each of said passive optical components is associated with at least one of said active optical components.

14. The method according to claim 1, wherein the passive optical components are components for redirecting light by at least one of refraction, diffraction.

15. The method according to claim 1, wherein each of the passive optical components comprises a lens or a prism.

16. The method according to claim 1, wherein each of the active optical components is allocated with at least one of the passive optical components.

17. The method according to claim 1, wherein each of the active optical components is a bar die.

18. The method according to claim 1, wherein each of the active optical components is a packaged component.

19. The method according to claim 1, comprising polishing the wafer obtained after hardening the transparent material.

20. The method according to claim 1, wherein each of the transparent elements has two opposing flat surfaces perpendicular to a vertical direction, wherein an extension of the optics wafer along the vertical direction is small with respect to the extension of the optics wafer along directions perpendicular to the vertical direction.

21. The method according to claim 1, wherein each of the transparent elements has parallel surfaces adjusted to a wafer thickness before producing the optical structures.

22. The method according to claim 1, wherein producing the optical structures comprises using replication.

* * * * *